United States Patent [19]

Azuma et al.

[11] Patent Number: 5,176,076
[45] Date of Patent: Jan. 5, 1993

[54] SCREEN PRINTER

[75] Inventors: Nobuyuki Azuma, Matsudo; Noriaki Mukai, Toride; Yasusuke Hayashi, Ibaraki, all of Japan

[73] Assignee: Hitachi Techno Engineering Co., Ltd., Tokyo, Japan

[21] Appl. No.: 650,007

[22] Filed: Feb. 4, 1991

[30] Foreign Application Priority Data

Feb. 5, 1990 [JP] Japan .................................. 2-024551

[51] Int. Cl.⁵ .................... B41L 13/18; B41L 27/00
[52] U.S. Cl. .................................. 101/123; 101/126
[58] Field of Search ............... 101/123, 124, 115, 126

[56] References Cited

U.S. PATENT DOCUMENTS

| 4,075,968 | 2/1978 | Caddock | 101/124 X |
| 4,648,317 | 3/1987 | Bubley et al. | 101/123 |
| 4,951,566 | 8/1990 | Melzer et al. | 101/123 |

FOREIGN PATENT DOCUMENTS

| 702298 | 3/1966 | Italy | 101/123 |
| 193367 | 11/1982 | Japan | 101/123 |

Primary Examiner—Edgar S. Burr
Assistant Examiner—Moshe I. Cohen
Attorney, Agent, or Firm—Antonelli, Terry, Stout & Kraus

[57] ABSTRACT

A screen printer effects a printing by moving a squeegee in contact with a screen to force a printing paste through a printing pattern formed on the screen. The squeegee is held by a squeegee head. The squeegee head includes a support member for supporting the squeegee in such a manner as to move the squeegee upward and downward, and at least one moving member which swingably supports the support member and is movable together with the support member. When the squeegee is to be exchanged, only the support member is angularly movable relative to the moving member so as to provide a sufficient space above the screen to facilitate the exchange of the squeegee.

13 Claims, 10 Drawing Sheets

SCREEN PRINTER

BACKGROUND OF THE INVENTION

This invention relates to a screen printer, and more particularly to a screen printer of the type in which only that portion supporting a squeegee is angularly turned up and down so as to facilitate the exchange of the squeegee.

In a screen printer, a screen or plate (i.e., printing pattern-bearing sheet) having a printing pattern is superposed on an object to be printed, and printing ink is coated onto the screen by the use of a squeegee, thereby effecting a printing. The squeegee is attached to a squeegee head through a support member. The squeegee head is supported by two parallel guide rails, and is movable by means of the combination of slide guides and the guide rails of a circular cross-section respectively receiving them. Conventional screen printers of such a construction are disclosed, for example, in Japanese Patent Unexamined Publication No. 62-84588 and Japanese Utility Model Unexamined Publication No. 62-154834.

However, recently, in the type of screen printer for printing a pattern, such as an electronic circuit, on a board, commercially-available guides of the linear motion-type employing ball bearings are used as guides for the squeegee head. Such guide of the linear motion-type is excellent in precision and smoothness of the guiding. Further, recently, instead of a pneumatic cylinder, a combination of an electric motor and a ball screw is used as a drive device for reciprocally moving the squeegee head, and this combination is excellent in smoothness of the movement and speed control.

In conventional screen printers, a guide mechanism, including guide rails, and the squeegee head are both supported on a frame. The whole of this frame is pivotally movable or movable upward and downward to provide a space below the squeegee for the purpose of exchanging the squeegee.

SUMMARY OF THE INVENTION

It is a main object of this invention to provide a screen printer in which a larger operation space can be provided between a squeegee head and a printer body so as to facilitate the exchange of a squeegee and also to reduce the time required for such squeegee exchange.

To achieve the above object, in the present invention, a squeegee head includes at least one moving member reciprocally movable, and a support member for supporting a squeegee. The support member is pivotally connected to the moving member. At the time of the exchange of the squeegee, only the support member is pivotally moved to a large extent to thereby provide an operation space.

According to one aspect of the present invention, there is provided a screen printer for effecting printing by forcing a printing paste through a printing pattern formed on a screen, comprising: at least one squeegee means for pressing the printing paste against the screen; a squeegee head for moving the squeegee means while keeping the squeegee means in contact with the screen, the squeegee head including at least one moving member movable along the screen, and a support member for supporting the squeegee means in such a manner as to move the squeegee means upward and downward to bring the squeegee means into contact with the screen, the support member being pivotally connected to the moving member; means connected to the moving member for reciprocally moving the squeegee head; and means mounted on the support member for pivotally moving the support member.

With this construction, when the squeegee is to be exchanged, a pivot operation of moving only the support member occurs. As a result, the squeegee supported on the lower side of the support member is turned upward to present itself to the outside, so that a sufficient operation space can be provided around the squeegee, thereby facilitating the exchange operation. Thus, according to the present invention, since only the support member supporting the squeegee is angularly turned up and down, the large operation space for the exchange of the squeegee is available, and besides that portion to be angularly moved is reduced in size. Therefore, the power required for this angular movement is reduced, and the space occupied by the whole of the printer can be reduced. Further, the exchange of the squeegee can be made easily, and the operator can effect this exchange operation in an easy posture, and therefore the operation space required for the squeegee exchange is reduced. Furthermore, a large operation space for cleaning the screen to remove dirt on the screen and to prevent the blinding of the screen is also available, and the registration of a board (object to be printed) with the screen can advantageously be carried out easily.

With one feature of the invention, the screen printer includes two guide rails for guiding the squeegee head. One of the two guide rails is disposed above the screen as in the conventional printer, and the other guide rail is fixedly mounted on a base of the printer, so that the heights of the two guide rails are different from each other. The squeegee head has a half-gate or half-portal shape as a whole, and is engaged with the guide rails, and the support member is pivotally connected to the higher guide rail. When the squeegee is to be exchanged from the side of the guide rail mounted on the upper surface of the base, this can be done without interference by the guide rail, and the operation space is further increased, thus facilitating the exchange operation.

With another feature embodying the invention, the support member is supported by at least one guide rail not only for straight movement but also for pivotal movement about this guide rail. Namely, this state of engagement of the support member enables the same not only to move straight along the guide rail but also to angularly move about the guide rail. This form is an example where the rod-like guide rail of a circular cross-section and a guide engaged with this guide rail and incorporating ball bearings therein are used. The support member is releaseably engaged with the other guide rail through the moving member. At the time of the exchange of the squeegee, the support member is disengaged from this other guide rail, and is pivotally moved about the first-mentioned guide rail, so that the squeegee is directed upward, thus further facilitating the exchange operation.

DETAILED DESCRIPTION OF THE PREFERRED EMBODIMENTS

For better understanding of the present invention, the construction and operation of conventional screen printers will first be described with reference to FIGS. 8 to 11.

Figure 8:
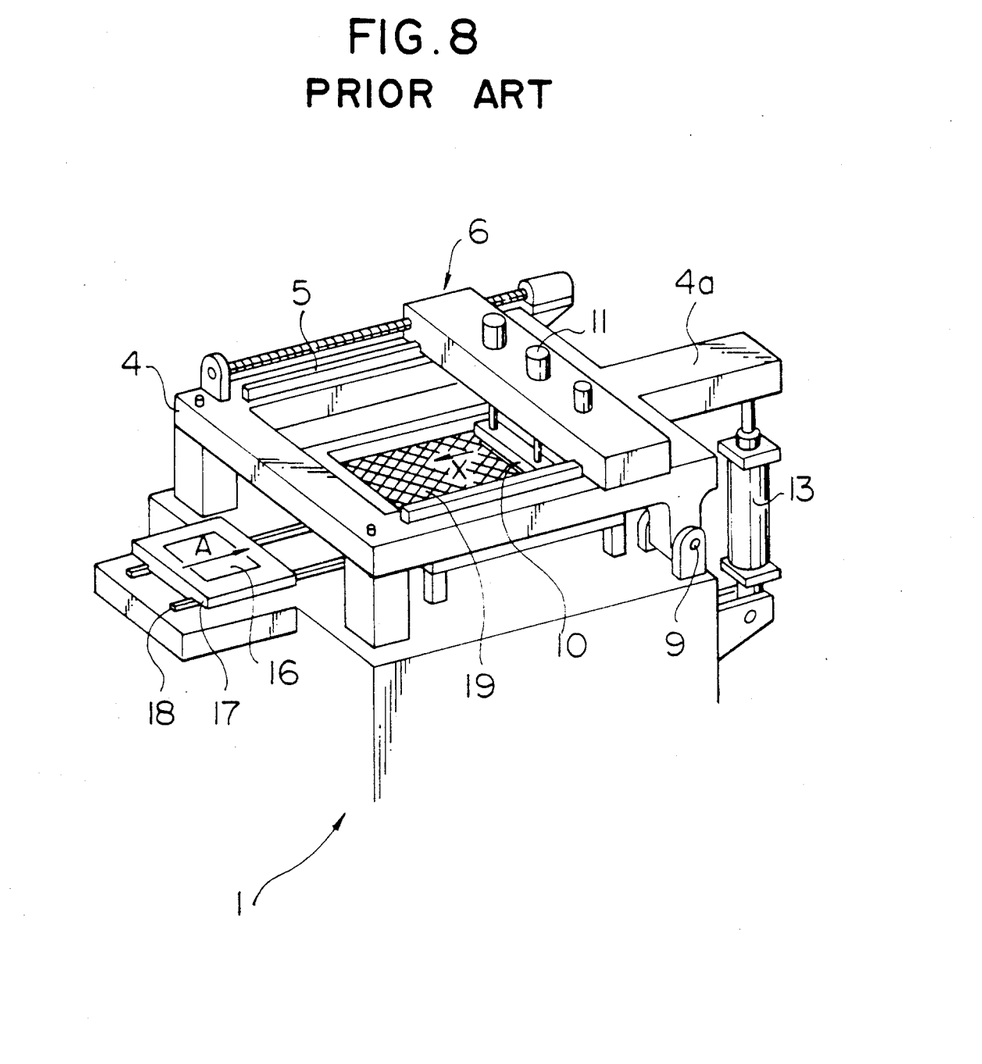
FIGS. 8 and 9 are perspective views showing conventional screen printers, respectively.

In a screen printer 1 shown in FIG. 8, a board (object to be printed) 16 is placed on a board support bed 17 which is connected to a board convey device 18. The board 16 is fed, together with the board support bed 17, in a direction of arrow A under the guidance of the board convey device 18, and arrives at a position beneath a screen (i.e., printing pattern-bearing sheet) 19. Then, a board elevating device (not shown) is operated, so that the board 16 and the board support bed 17 are moved upward and are held at a position spaced a predetermined distance from the lower surface of the screen 19.

Figure 9:
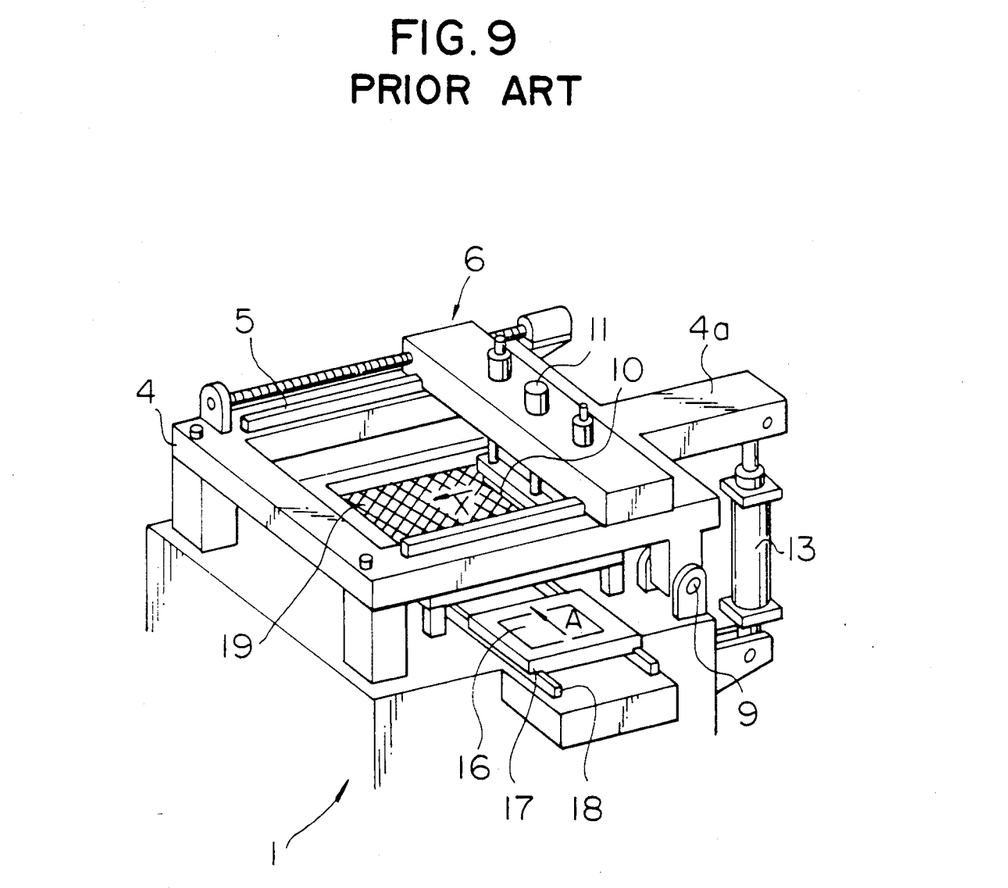

Then, a squeegee 10 is moved while kept in contact with the screen 19 under a predetermined pressure. The squeegee 10 is guided by guide rails 5, mounted on a frame 4, and is moved in a direction of arrow X. When the squeegee 10 is thus moved, a printing paste on the upper surface of the screen 19 is forced through a pattern formed on the screen 19, so that this pattern is printed on the upper surface of the board 16. Thus the printed board 16 is moved downward by the above-mentioned board elevating device, and then is conveyed from the position beneath the screen 19. As shown in FIGS. 8 and 9, there are two directions of conveyance of the board 16 into and out of the position beneath the screen 19, depending on the layout of the installation place of the screen printer 1.

The squeegee 10 is an elongated, elastic plate-like member. At the time of the printing, the squeegee 10 is slidingly moved over the screen 19 while held in contact with the screen 19 by a squeegee support device 11 under a predetermined contact pressure. Therefore, the distal end of the squeegee 10 is worn. When the amount of this wear becomes large, the squeegee 10 needs to be exchanged. Also, when the printing conditions such as the kind of the printing paste, the kind of the screen 19 and the sliding movement speed, are changed, it is necessary to exchange the squeegee 10 with another type so as to meet such printing conditions. In this case, a space for exchanging the squeegee is provided between the squeegee 10 and the screen 19, and then the exchange operation is carried out.

Figure 10:
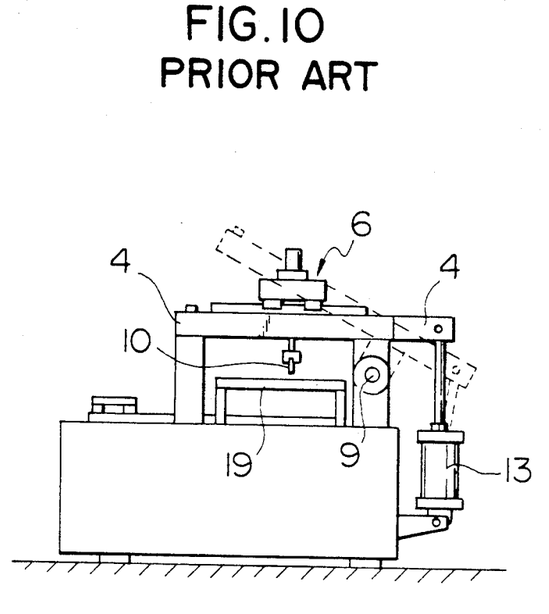
FIGS. 10 and 11 are schematic views respectively showing the manner of pivotal movement of a squeegee head and the manner of upward and downward movement of another squeegee head in the conventional screen printers.

For this purpose, in the conventional screen printer shown in FIG. 8 or 9, a cylinder 13 is provided. The cylinder 13 is connected to an arm 4a, formed on one end of the frame 4, so as to lift a squeegee head 6 engaged with the guide rails 5 on the frame 4. When the cylinder 13 is operated, the frame 4 is angularly moved upward about a hinge 9, as shown in FIG. 10, so that an operation space for exchanging the squeegee 10 is provided above the screen 19.

Figure 11:
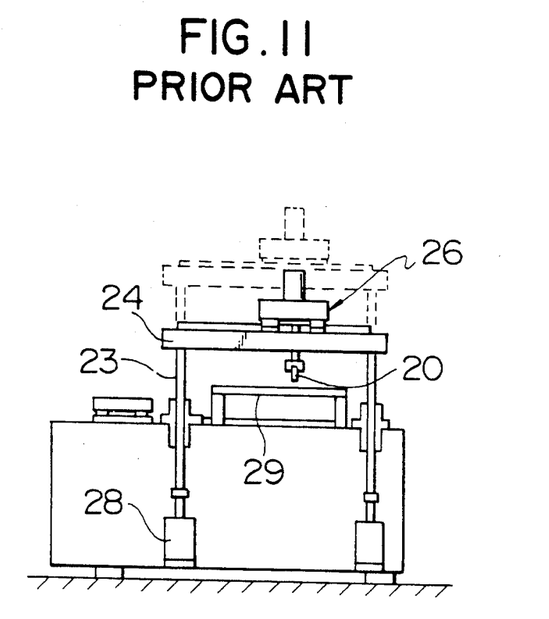

In another example of conventional screen printer shown in FIG. 11, frame elevating devices 28 are connected respectively to support posts 23 supporting a frame 24. When the frame elevating devices 28 are operated, a squeegee head 26 is moved upward together with the frame 24, so that an operation space for exchanging a squeegee 20 is provided above a screen 29.

In the above conventional screen printers, however, the frame 4 or 24 is very heavy since a drive device for reciprocally moving the squeegee head, etc., are also mounted on the frame. Therefore, the load on the frame angular movement cylinder 13 or the frame elevating device 28 is large. As a result, the cylinder 13 or the elevating device 28 is of a large size, which results in problems that a large space is occupied and that the cost is increased. Further, in both the case of angularly moving the frame and the case of elevating the frame, the space available is not sufficient to easily carry out the exchange of the squeegee 10 or 20, and much time is required for this exchange operation.

The screen printer of the present invention will now be described on the basis of embodiments thereof with reference to the accompanying drawings.

Figure 1:
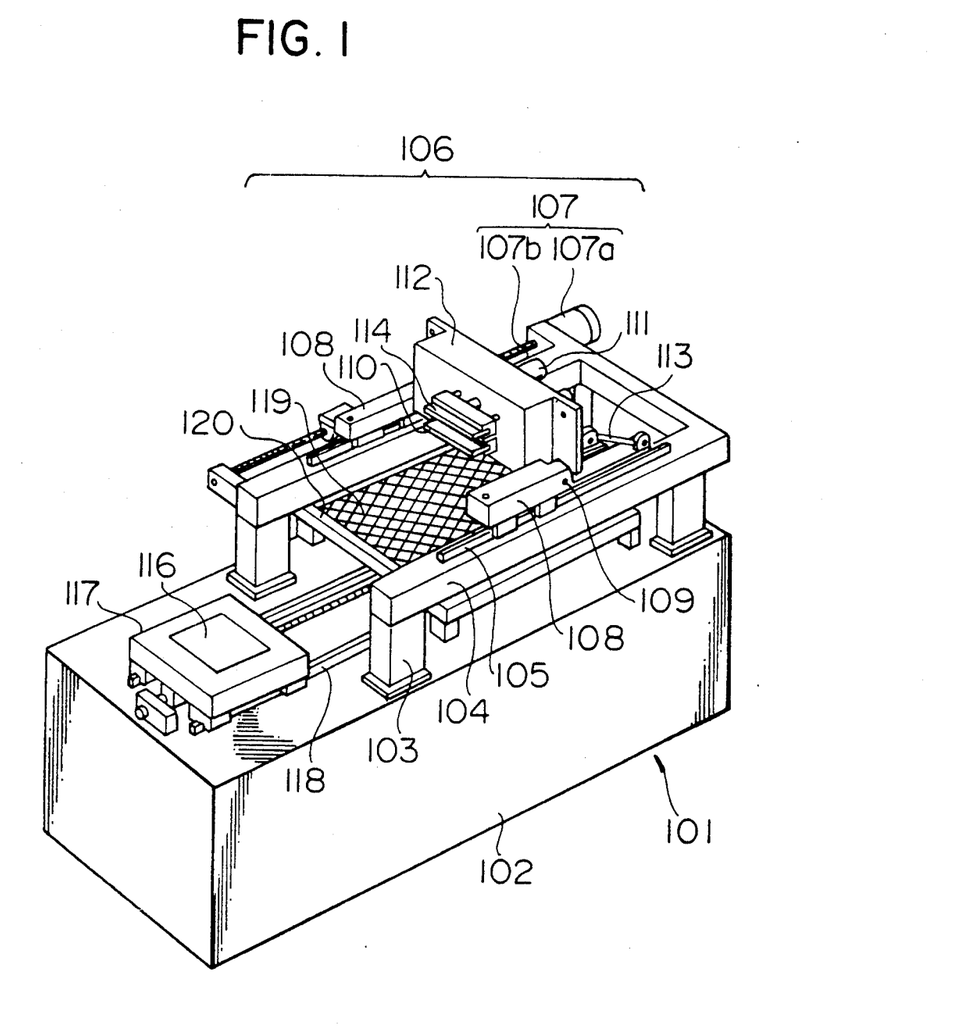
FIG. 1 is a perspective view of a screen printer according to the first embodiment of the invention.
Figure 2:
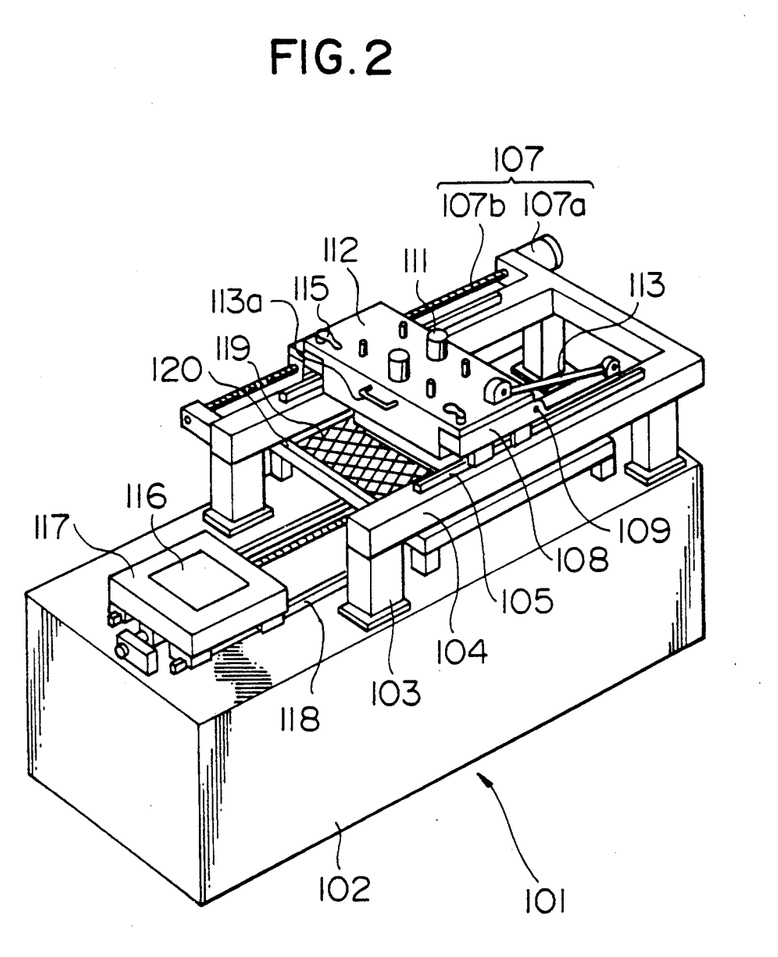
FIG. 2 is a perspective view of the screen printer of FIG. 1 in a printing condition.

Referring to FIGS. 1 and 2, a screen printer 101 according to the first embodiment of the invention comprises a base 102 on which a frame 104 is mounted through four support posts 103. The frame 104 is of a generally U-shape which is defined by a pair of parallel portions connected with each other at their one ends. Two guide rails 105 are fixedly mounted on the two parallel portions of the frame 104, respectively. A squeegee head 106 is guided by the guide rails 105. A drive device 107 for reciprocally moving the squeegee head 106 is mounted on the frame 104.

The squeegee head 106 comprises a pair of first and second moving members 108, a support member 112 connected to the two moving members 108 by hinges 109, and a cylinder 113 connected between the support member 112 and one of the moving members 108. The two moving members 108 are engaged with the two guide rails 105, respectively, and the first moving member 108 is connected to the drive device 107 so that both the moving members move over the frame 104 by the operation of the drive device 107. Mounted on the support member 112 is a squeegee support device 111 for vertically movably holding a squeegee 110. By the operation of the cylinder 113, the support member 112 is pivotally moved about the hinges 109 between a first position where the squeegee 110 is directed downward and a second position where the squeegee 110 is disposed substantially horizontally.

Instead of connecting the moving members 108 with each other by means of the support member 112, a separate means may be provided for connecting the first moving member with the second moving member so that the support member itself can be reduced in weight to facilitate the pivotal movement thereof.

FIG. 1 shows the condition in which the support member 112 has been angularly moved upward. In this embodiment, in addition to the squeegee 110, a scraper 114 is provided.

When a circuit pattern or the like is to be printed on a board (object to be printed) 116, the support member 112 is angularly moved downward or turned down from the position of FIG. 1, and is placed on the moving members 108, as shown in FIG. 2. In this condition, the support member 112 is fixed to the moving members 108 by fixing members 115.

As in the above-mentioned conventional printers, the board 116 is placed on a board support bed 117, and is guided by a board convey device 118 to be moved to a position beneath a screen 119. The board support bed 117 has a suction fixing device for fixing the board 116. The screen 119 is attached to a support frame 120, and is held at a predetermined height so as to allow an easy conveyance of the board 116 to the position beneath the screen 119. When the board 116 arrives at the predetermined position beneath the screen 119, and is stopped at this position, a board elevating device (not shown) mounted on the board support bed 117 is operated. By the operation of this board elevating device, the board 116 is moved upward to a height spaced a predetermined distance from the screen 119, and is held at this position.

Then, a printing paste is supplied to the support surface of the screen 119. After the supply of the printing paste, the squeegee 110 is moved downward by the squeegee support device 111, so that the squeegee 110 is brought into contact with the screen 119 under a predetermined pressure. In this condition, the reciprocal movement drive device 107 is operated to move the squeegee head 106 along the guide rails 105. As the squeegee head 106 is thus moved, the squeegee 110 forces the printing paste through the screen 119, thereby printing the pattern of the screen 119 onto the board 116.

After one printing process is completed, by the operation of the squeegee support device 111, the squeegee 110 is moved upward, and instead the scraper 114 is moved downward. Subsequently, the reciprocal movement drive device 107 is operated to move the squeegee head 106 in a direction opposite to the direction of movement thereof for the printing process, thereby returning the squeegee head 106 to its initial position. At this time, the scraper 114 levels the printing paste, which has been made uneven by the squeegee 110, so as to smooth out the printing paste on the upper surface of the screen 19 into a predetermined uniform thickness, thereby making preparations for the next printing process.

Depending on the printing conditions, the scraper 14 may be omitted, or two squeegees 110 may be attached so as to carry out two printing processes by one reciprocal movement of the squeegee head 106. As described above, the squeegee support device 111 serves to maintain the contact pressure of the squeegee 110 and also to move the squeegee 110 upward and downward. Therefore, the squeegee support device 111 may be a pneumatic cylinder as in the conventional printer. Further, in this embodiment, although the reciprocal movement drive device 107 comprises an electric motor 107a whose speed can be easily controlled, and a ball screw 107b, this device may alternatively comprise a pneumatic cylinder as in the conventional printer.

As described above in connection with the conventional screen printers, the distal end of the squeegee 110 is worn after repeated printing operations, and therefore it need to be exchanged. Also, when the printing conditions, such as the kind of the printing paste, the kind of the screen 19 and the kind of the board 116, are changed, it is necessary to exchange the squeegee 110 with another type having of such material and shape as to meet such printing conditions.

Figure 1A:
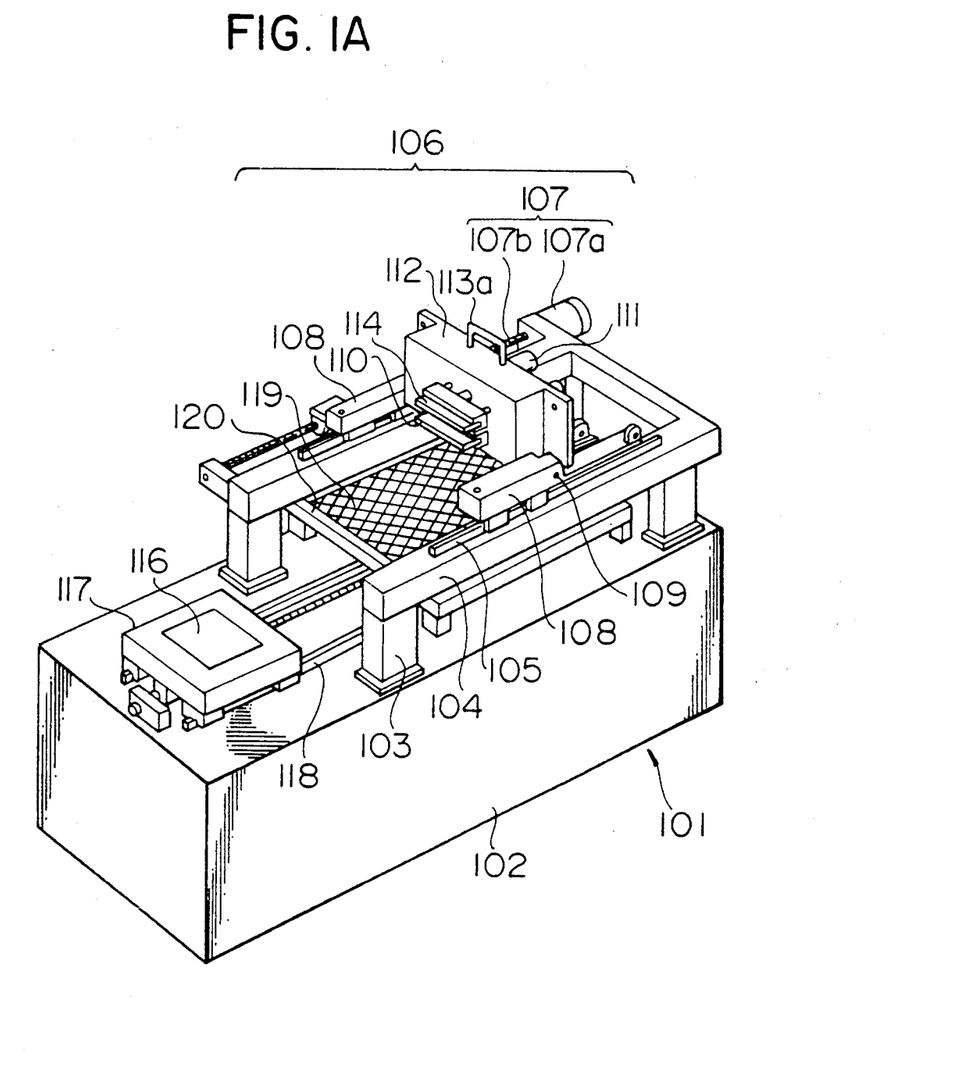
FIG. 1A is a perspective view showing a modification of the screen printer of FIG. 1.

In the screen printer 101 of this embodiment when the squeegee 110 is to be exchanged, the fixing members 115 are first loosened. Then, the cylinder 113 is operated to pivotally move the support member 112 about the hinges 109, thereby providing a sufficient space relative to the squeegee 110 as shown in FIG. 1, and in this condition the squeegee 110 is exchanged with another squeegee. In the case where the screen printer is of a small size, or in the case where the rotational moment of the support member 112 is small, a handgrip 113a may be provided instead of the cylinder 113 as shown in FIG. 1A, in which case the support member 112 is manually moved angularly by means of the handgrip 113a.

The hinges 109 may be provided at such positions that the support member 112 can be angularly moved in such a direction as to facilitate the exchange of the squeegee 110. In the embodiment shown in FIG. 1, the axis of rotation of the hinges 109 is disposed substantially perpendicular to the guide rails 105, so that the support member 112 can be angularly moved along the direction of conveyance of the board 116. On the other hand, in a screen printer 201 according to the second embodiment of the invention shown in FIG. 3, hinges 209 are disposed in such a manner that their axis of rotation is parallel to guide rails 105. Therefore, a squeegee support member 212 is angularly movable in a direction perpendicular to the direction of conveyance of the board 116.

Incidentally, in the following description of the other embodiments of the invention, those parts similar in function to the corresponding parts of the first embodiment are denoted by the same reference numerals and explanation thereof will be omitted, and only those parts different from the parts of the first embodiment will be explained.

Figure 3:
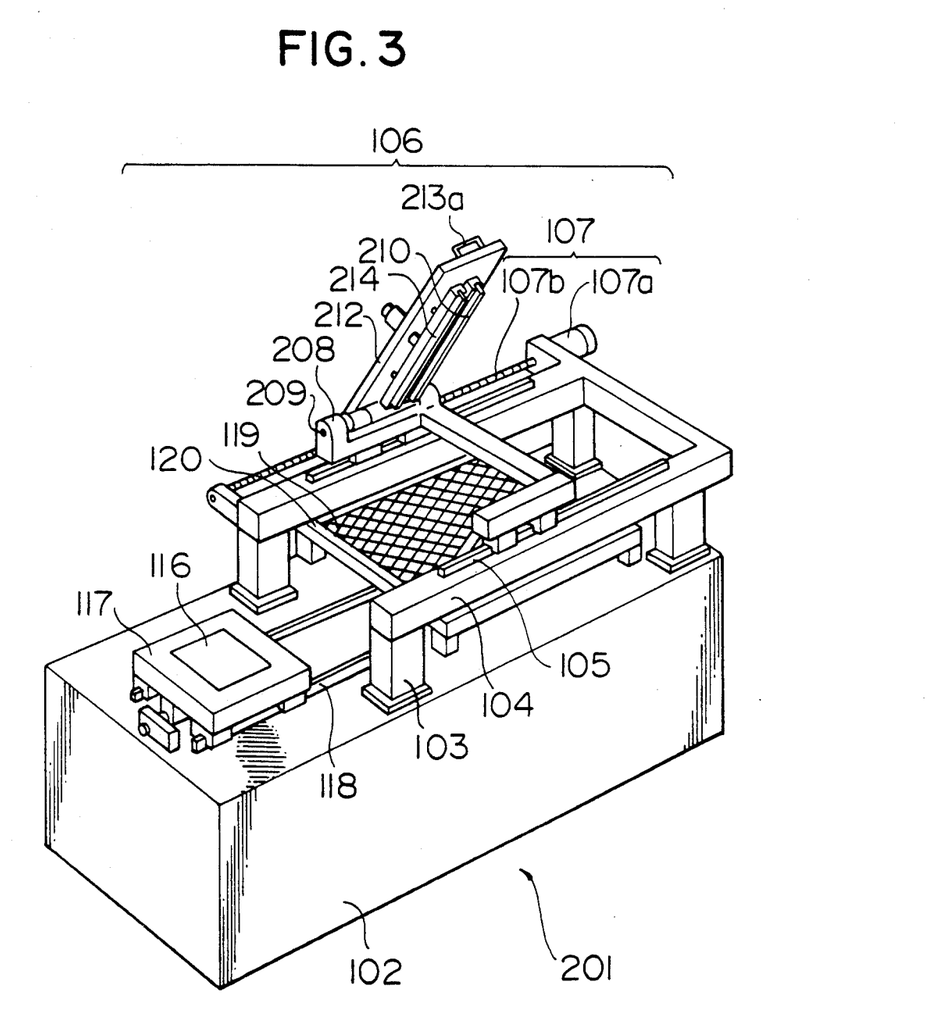
FIG. 3 is a perspective view of a screen printer according to the second embodiment of the invention.

In the screen printer 201 of the second embodiment, a moving member 208 of one body is provided in a squeegee head 106. The support member 212 is pivotably connected to the moving member 208 through the hinges 209 which are provided on the moving member 208 in parallel relation to guide rails 105. A squeegee 210 and a scraper 214 are attached to the support member 212. A handgrip 213a for angularly moving the support member 212 is mounted on one longitudinal end of the support member 212.

When the exchange of the squeegee 210 is to be made from the direction perpendicular to the direction of movement of the squeegee head 106, one of the guide rails 105 close to the operator is obstructive to this exchange operation. FIGS. 4 to 7 show embodiments of the invention which take this point into consideration. In these embodiments, one guide rail remote from the operator is mounted on a frame supported by support posts 103 whereas the other guide rail close to the operator is mounted directly on the upper surface of a base 102. Further, one moving member of the squeegee head, which is engaged with the guide rail close to the operator, is formed in an elongated plate-like shape extending upwardly so as to correspond in height to the other moving member. Therefore, as a whole, the squeegee head has an inverted J-shape or inverted L-shape as viewed in the direction of conveyance of a board 116. In the specification, this shape is referred to as "half-gate or half-portal shape".

Figure 4:
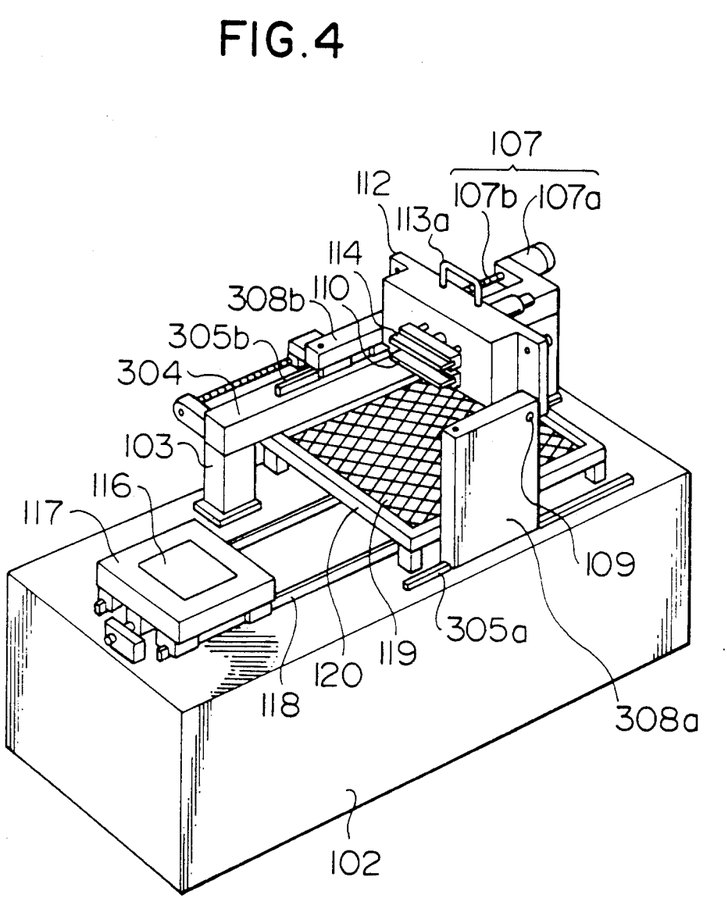
FIG. 4 is a perspective view of a screen printer according to the third embodiment of the invention, wherein a moving member of a half-gate shape is employed.

FIG. 4 shows a screen printer according to the third embodiment of the invention which is a modified form of the first embodiment in view of the above point. In this screen printer, a frame 304 is constituted by one elongated member, and is mounted on two support posts 103 which are provided on the upper surface of a base 102 adjacent to one side thereof. As in the first embodiment, a first guide rail 305b is fixedly mounted on the frame 304, and a first moving member 308b is engaged with this guide rail 305b. A second guide rail 305a is mounted directly on the base 102, and a second moving member 308a is in the form of a plate extending upwardly in accordance with the second guide rail 305a. A support member 112 of a squeegee head is pivotably connected to the moving members 308a and 308b through hinges 109, and the hinges 109 are disposed perpendicular to the guide rails 305a and 305b.

Figure 5:
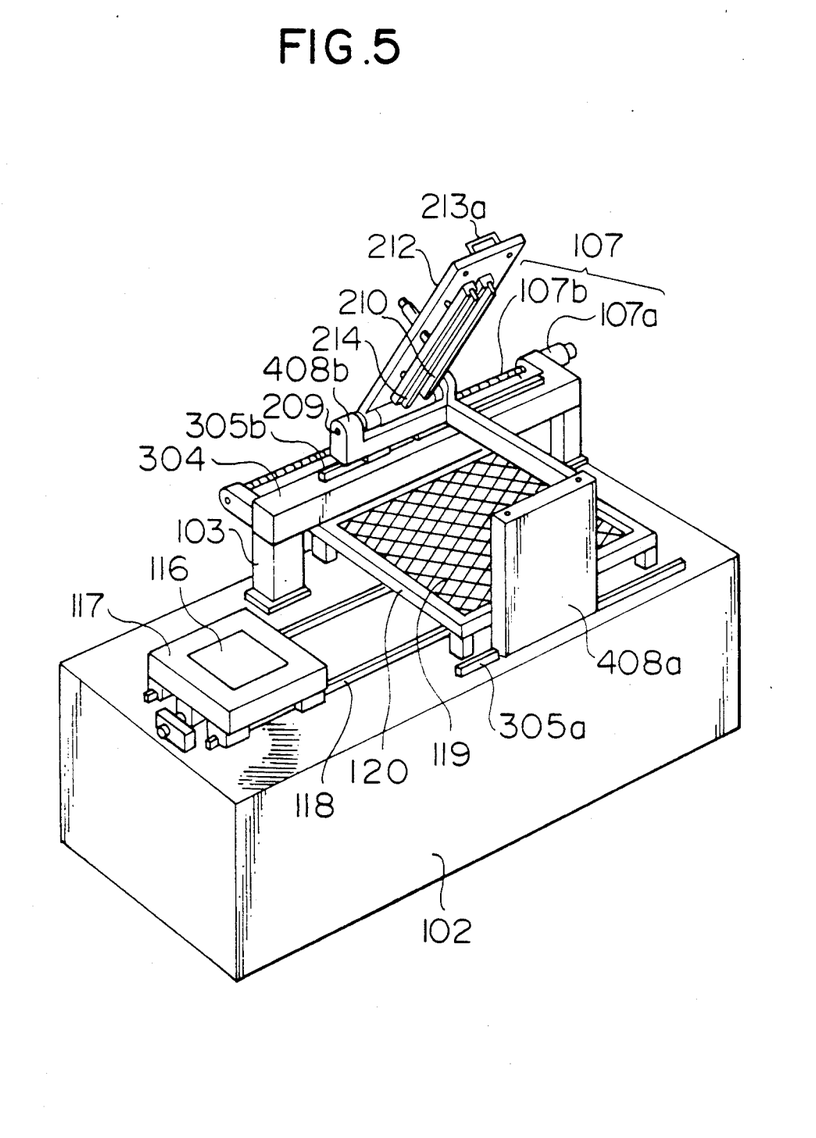
FIG. 5 is a perspective view of a screen printer according to the fourth embodiment of the invention, in which the direction of pivotal movement of a squeegee support member is different from that of the preceding embodiments.

FIG. 5 shows a screen printer according to the fourth embodiment of the invention which is a modified form of the second embodiment in view of the access to an operation space for the exchange of a squeegee. In this screen printer, a frame 304 and guide rails 305a and 305b are arranged in the same manner as described above for the third embodiment. As in the second embodiment, a first moving member 408b is engaged with the guide rail 305b, and a support member 212 is pivotably connected to the moving member 408b through hinges 209 which are disposed parallel to the guide rails 305. As in the third embodiment, a second moving member 408a has a plate-like shape, and is connected to the moving member 408b.

Figure 6:
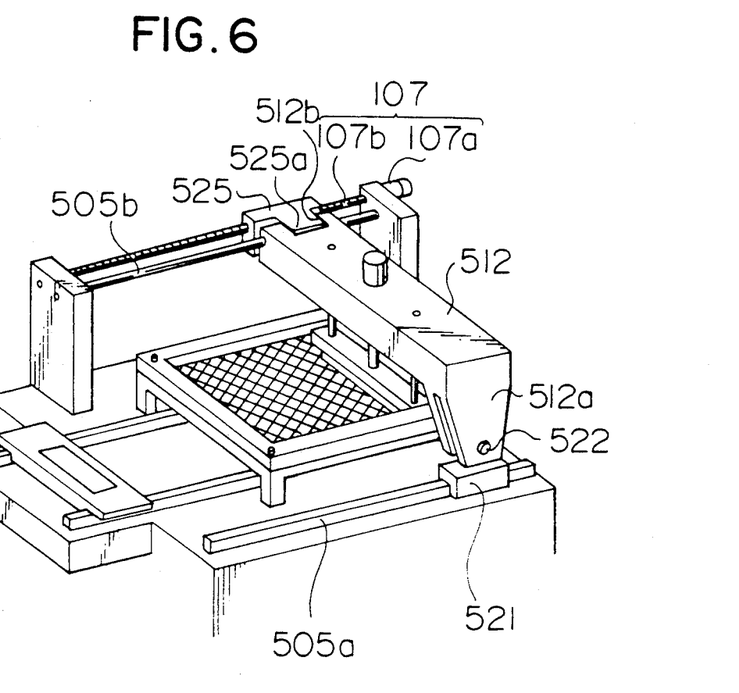
FIG. 6 is a perspective view of a screen printer according to the fifth embodiment of the invention.
Figure 7:
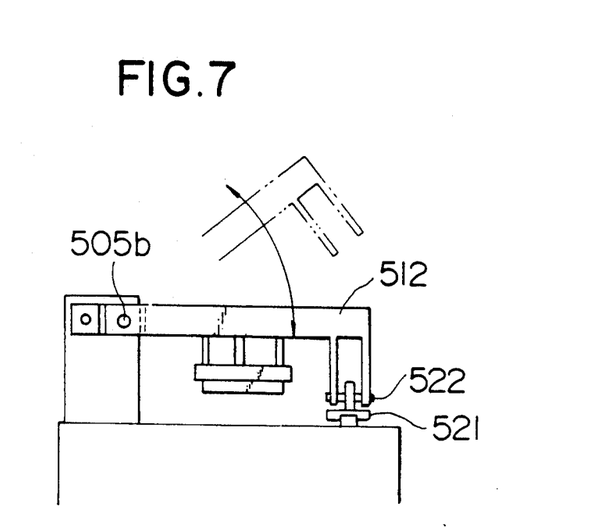
FIG. 7 is a schematic view showing the manner of pivotal movement of a squeegee support member in the printer of FIG. 6.

FIGS. 6 and 7 show a screen printer according to the fifth embodiment of the invention in which a squeegee support member 512 has an integral leg 512a to be in a half-gate or half-portal shape as a whole. The support member 512 is angularly movable, together with the leg 512a, in a direction perpendicular to the direction of conveyance of a board, thereby further increasing an operation space for the exchange of a squeegee.

More specifically, in this embodiment, a second guide rail 505a is fixedly mounted directly on a base of the printer, as in the third and fourth embodiments. A second moving member 521 is engaged with the second guide rail 505a. The leg 512a of the support member 512 is connected to the moving member 521 by means of a removable pin 522. A first guide rail 505b is in the form of a rod of a circular cross-section, and is supported at its opposite ends to extend above a base in parallel relation to the upper surface of this base. The support member 512 is angularly movably and slidably connected at one end thereof to the guide rail 505b. A ball screw 107b of a drive device for reciprocally moving a squeegee head is disposed parallel to the guide rail 505b. A first moving member 525 is operatively engaged with the ball screw 107b. The moving member 525 has a key-shaped projection 525a. On the other hand, the support member 512 has a groove 512b complementary to the projection 525a, and the projection 525a is angularly movably fitted in the groove 512b.

Therefore, at the time of the printing, the moving member 525 drives the support member 512 through the engagement between the projection 525a and the groove 512b, thereby moving the squeegee head. When it is necessary to exchange the squeegee, the pin 522 is removed, so that the support member 512 is angularly movable about the guide rail 505b. At the time of the angular movement of the support member 512, the groove 512b of the support member 512 slides relative to the projection 525a of the moving member 525, and therefore the engagement between the groove 512b and the projection 525a does not prevent the angular movement of the support member 512.

Although the present invention has been described above with reference to the preferred embodiments, the invention itself is not to be restricted to such specific forms, and various modifications can be made without departing from the scope of the appended claims, and other forms of the invention can be adopted. For example, in the illustrated embodiments, although the squeegee head is pivotally movable upward through an angle of about 90°, it may be formed to be pivotally movable through an angle of over 90°, depending on the type of the printer. Also, with respect to the embodiments shown respectively in FIGS. 3 and 6, the moving member for movement in accordance with the other moving member driven may be omitted, in which case the end of the support member is adapted to be releaseably engaged directly with the guide rail.

What is claimed is:

1. A screen printer for printing by forcing a printing paste through a printing pattern formed on a screen, comprising:

squeegee means for pressing the printing paste against the screen;

a squeegee head for moving said squeegee means while keeping said squeegee means in contact with the screen, said squeegee head including a first moving member, a second moving member and a support member for supporting said squeegee means in such a manner as to move said squeegee means upward and downward to bring said squeegee means into contact with the screen, said support member being pivotally connected to one of said first moving member or said second moving member, said first moving member being connected to said second moving member, both of said first moving member and said second moving member moving together;

means for reciprocally moving said squeegee head, said reciprocally moving means including first guide rail, a second guide rail and a drive member connected to said first moving member, said first guide rail and said second guide rail guiding said first moving member and said second moving member, respectively; and means mounted on said support member for pivotally moving said support member.

2. A screen printer according to claim 1, wherein said support member is pivotally movable to angularly move said squeegee means upward through an angle of at least 90° from a position where said squeegee means is in contact with the screen.

3. A screen printer according to claim 1, wherein said squeegee means comprises an elongated elastic plate-like member, said support member being pivotally movable between a first position where said plate-like member is disposed substantially perpendicular to the screen and a second position where said plate-like member is disposed substantially parallel to the screen.

4. A screen printer according to claim 1, further comprising means for conveying an object to be printed between a first position beneath the screen and a second position not beneath the screen, said support member being pivotally movable along a direction of conveyance of the object to be printed.

5. A screen printer according to claim 1, further comprising means for conveying an object to be printed between a first position beneath the screen and a second position not beneath the screen, said support member being pivotally movable in a direction substantially transverse to a direction of conveyance of the object to be printed.

6. A screen printer according to claim 1, wherein said support member includes a hinge connecting said first moving member and said second moving member for pivotal movement.

7. A screen printer according to claim 1, wherein said support member includes a hinge for pivotal movement with respect to said first moving member.

8. A screen printer according to claim 7, wherein an axis of rotation of said hinge is disposed perpendicular to said first guide rail and said second guide rail.

9. A screen printer according to claim 7, wherein an axis of rotation of said hinge is disposed parallel to said guide rails.

10. A screen printer according to claim 7, further comprising a fixing member for releasably fixing said support member to said second moving member.

11. A screen printer according to claim 1, wherein said second guide rail is disposed at a position lower than said first guide rail, said squeegee head being located adjacent to the screen and having a substantially inverted L-shape.

12. A screen printer according to claim 1, wherein said support member is pivotally connected to said first guide rail, said first moving member engaging said support member and being guided by said first guide rail, and said support member being engaged with said first moving member in such a manner that said support member is pivotally movable about said first guide rail and that said first moving member drives said support member along said first guide rail.

13. A screen printer according to claim 12, wherein said second guide rail is disposed at a position lower than said first guide rail, said support member having a substantially inverted L-shape, and said squeegee head is located adjacent to the screen.

* * * * *